(12) United States Patent
Friedrich et al.

(10) Patent No.: US 8,767,868 B2
(45) Date of Patent: Jul. 1, 2014

(54) SIGNAL PROCESSING CIRCUIT AND METHOD

(75) Inventors: Dirk Friedrich, Munich (DE); Andreas Holm, Vaterstetten (DE)

(73) Assignee: Intel Mobile Communications GmbH, Neubiberg (DE)

( * ) Notice: Subject to any disclaimer, the term of this patent is extended or adjusted under 35 U.S.C. 154(b) by 71 days.

(21) Appl. No.: 13/403,240

(22) Filed: Feb. 23, 2012

(65) Prior Publication Data

US 2012/0219088 A1  Aug. 30, 2012

(30) Foreign Application Priority Data

Feb. 25, 2011  (DE) .......................... 10 2011 004 752

(51) Int. Cl.
*H04L 25/49* (2006.01)
(52) U.S. Cl.
USPC ........................................ 375/296
(58) Field of Classification Search
USPC ........... 375/296, 219, 295, 316; 332/127, 128
See application file for complete search history.

(56) References Cited

U.S. PATENT DOCUMENTS

| | | | |
|---|---|---|---|
| 5,231,398 A | 7/1993 | Topper | |
| 6,211,747 B1 * | 4/2001 | Trichet et al. | ................. 332/128 |
| 6,441,660 B1 | 8/2002 | Ingino, Jr. | |
| 6,873,218 B2 | 3/2005 | Khlat | |
| 7,433,436 B2 | 10/2008 | Gunzelmann et al. | |
| 7,627,299 B2 | 12/2009 | Muenker et al. | |
| 2005/0254561 A1 | 11/2005 | Seo et al. | |
| 2009/0305649 A1 | 12/2009 | Muenker et al. | |

FOREIGN PATENT DOCUMENTS

| | | |
|---|---|---|
| CN | 1451202 A | 10/2003 |
| CN | 101729066 A | 6/2010 |
| EP | 0649580 B1 | 4/1995 |
| EP | 0800282 B1 | 10/1997 |

* cited by examiner

*Primary Examiner* — Khai Tran
(74) *Attorney, Agent, or Firm* — Eschweiler & Associates, LLC

(57) ABSTRACT

A signal processing circuit for providing a modulated analog transmit signal on the basis of a digital transmit data signal is configured to vary a resolution in dependence on a detected or predefined parameter when providing the modulated analog transmit signal.

26 Claims, 10 Drawing Sheets

| data rate (Mbps) | relative constellation error (dB) | EVM (%RMS) |
|---|---|---|
| 6 | -5 | 56.2 |
| 9 | -8 | 39.8 |
| 12 | -10 | 31.6 |
| 18 | -13 | 22.3 |
| 24 | -16 | 15.8 |
| 36 | -19 | 11.2 |
| 48 | -22 | 7.9 |
| 54 | -25 | 5.6 |

FIG 3

SIGNAL PROCESSING CIRCUIT AND METHOD

CROSS-REFERENCE TO RELATED APPLICATIONS

This application claims priority from German Patent Application No. 102011004752.2-35, which was filed on Feb. 25, 2011 and is incorporated herein in its entirety by reference.

FIELD

Embodiments of the present invention provide a signal processing circuit configured to provide a modulated analog transmit signal on the basis of a digital transmit data signal. Further embodiments provide a signal processing circuit configured to provide a digital receive data signal on the basis of a modulated analog receive signal. Further embodiments provide methods of providing a modulated analog transmit signal or a digital receive data signal.

BACKGROUND

A transceiver is generally designed such that any requirements of the system may be met in any operating conditions. This means that the highest system requirement and the strictest application conditions are the design specification for the circuits. Therefore, in most cases of application, circuit components are too good, i.e. they do not function efficiently in terms of power input and current consumption.

SUMMARY

One embodiment comprises a signal processing circuit configured to provide a modulated analog transmit signal on the basis of a digital transmit data signal; the signal processing circuit being configured to vary a resolution based on a detected or predefined, parameter when providing the modulated analog transmit signal.

Another embodiment comprises a signal processing circuit configured to provide a modulated analog transmit signal on the basis of a digital transmit data signal; the signal processing circuit having a digital signal processing part, an analog signal processing part and at least one table having a plurality of values of the transmitting power of the modulated analog transmit signal or ranges of values of the transmitting power of the modulated analog transmit signal. In the table a value or a range of values of the transmitting power of the modulated transmit signal has associated therewith a bit width, which is to be set, of the digital signal processing part, and the signal processing circuit is configured to set the bit width of the digital signal processing part on the basis of the at least one table and based on the transmitting power of the modulated analog transmit signal. The bit width is set to reduce—in a predefined lower transmitting power range of the modulated analog transmit signal when there is a decrease in the transmitting power of the modulated analog transmit signal—a bit width of the digital signal processing part such that an actual curve of the spectral mask (SEM) of the signal processing circuit at least in the lower transmitting power range is below a requirement curve for the spectral mask. In addition, the bit width is set to increase the bit width of the digital signal processing part in the event of an increase in the transmitting power of the modulated analog transmit signal when the actual curve of the spectral mask approximates the requirement curve for the spectral mask. The signal processing circuit is further configured to reduce a supply voltage or a biasing current of the analog signal processing part—in a predefined upper transmitting power range of the modulated analog transmit signal—when the transmitting power of the modulated analog transmit signal increases, such that an actual curve of the adjacent channel leakage ratio of the signal processing circuit will be below, at least in the upper transmitting power range, a requirement curve for the adjacent channel leakage ratio.

According to another embodiment, a method of providing a modulated analog transmit signal on the basis of a digital transmit data signal comprises varying a resolution based on a detected or predefined parameter when providing the modulated analog transmit signal.

According to another embodiment, a method of providing a digital receive data signal on the basis of a modulated analog receive signal comprises varying a resolution based on a detected or predefined parameter when providing the digital receive data signal.

According to another embodiment, a computer program comprises a program code for performing a method of providing a modulated analog transmit signal on the basis of a digital transmit data signal, wherein the method comprises varying a resolution based on a detected or predefined parameter when providing the modulated analog transmit signal, when the program runs on a computer.

According to another embodiment, a computer program comprises a program code for performing a method of providing a digital receive data signal on the basis of a modulated analog receive signal, wherein the method comprises varying a resolution based on a detected or predefined parameter when providing the digital receive data signal, when the program runs on a computer.

Embodiments of the present invention provide a signal processing circuit configured to provide a modulated analog transmit signal on the basis of a digital transmit data signal. The signal processing circuit is configured to vary a resolution based on a detected or predefined parameter when providing the modulated analog transmit signal.

Further embodiments of the present invention provide a signal processing circuit configured to provide a digital receive data signal on the basis of a modulated analog receive signal. In these embodiments, the signal processing circuit is configured to vary a resolution based on a detected or predefined parameter when providing the digital receive data signal.

BRIEF DESCRIPTION OF THE DRAWINGS

Embodiments of the present invention will be detailed subsequently referring to the appended drawings, in which:

FIG. 3 shows a table comprising requirements placed upon the transmit signal quality in dependence on the type of modulation by taking the example of WLAN;

FIG. 5b shows a diagram for presenting a comparison of current consumptions of a typical transmitter exhibiting the typical ACLR behavior shown in FIG. 5a and of an optimized transmitter exhibiting the optimized ACLR behavior shown in FIG. 5a;

DETAILED DESCRIPTION

Figure 1A:
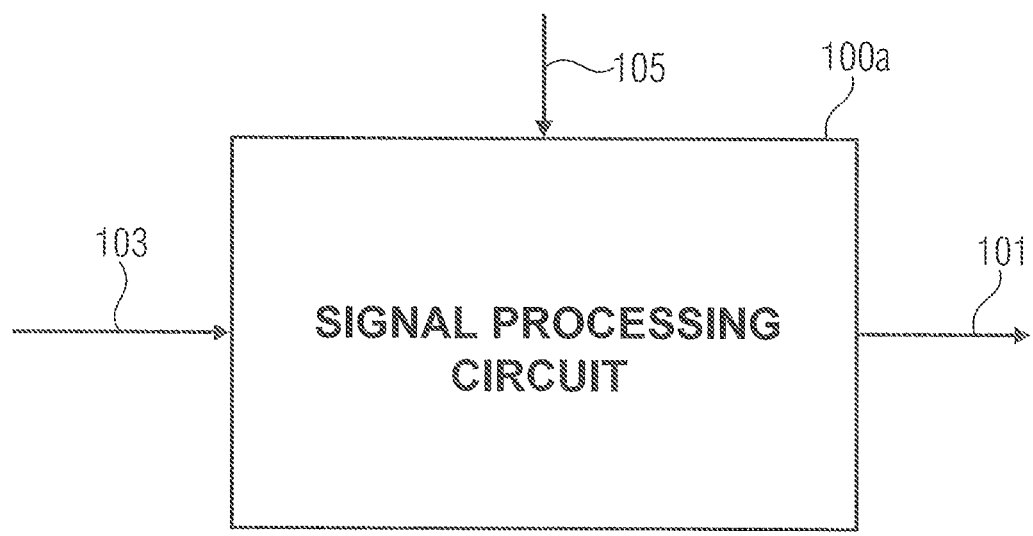
FIGS. 1a-1c show schematic representations of three different signal processing circuits in accordance with embodiments of the present invention.

Before embodiments of the present invention will be described in detail below with reference to the accompanying figures, it shall be noted that identical elements or elements having identical functions are provided with identical reference numerals, and that repeated descriptions of said elements will be dispensed with. Descriptions of elements having identical reference numerals are therefore interchangeable.

FIG. 1a shows a schematic representation of a signal processing circuit 100a or of a transmitter 100a configured to provide a modulated analog transmit signal 101 on the basis of a digital transmit data signal 103. The signal processing circuit 100a is configured to vary a resolution based on a detected or predefined parameter 105 when providing the modulated analog transmit signal 101.

It has been found that requirements placed upon the modulated analog transmit signal 101 will vary as a function of various parameters, or, in other words, that, given different operating conditions, the requirements to be met will change. An idea of the embodiments is that the signal processing circuit 100a adapts to the changing requirements (which are determined by the detected or predefined parameter 105). It has been found that, if only so much performance is made available as is useful for meeting the requirements, the overall current consumption of the signal processing circuit 100a will decrease and, consequently, the efficiency of the signal processing circuit 100a will increase.

In addition, it has been found that an increase in efficiency that is easy to implement may be achieved if the resolution in the provision of the modulated analog transmit signal 101 is varied, since in modern signal processing circuits, a major part of signal processing is typically on the basis of a digital level rather than on an analog level, as used to be the case. The resolution may include, e.g., a temporal resolution (e.g. a clock rate) and a digital resolution (e.g. a bit width or an order of the individual components of the signal processing circuit 100a). Therefore, the signal processing circuit 100a is configured to meet (e.g. with a maximum resolution) any standards that may be applied to the modulated analog transmit signal 101, and is further configured to reduce this resolution, for example, more relaxed requirements, so as to increase an efficiency of the signal processing circuit 100a. For example, the signal processing circuit 100a may comprise a digitally adjustable part, a digital part, or a digital signal processing part, at which the resolution is varied based on the fixed or predefined parameter 105. With such digital circuits, the resolution may be adjusted via control bits, for example. The signal processing circuit 100a is therefore configured to vary, when varying the resolution, digital parameters such as clock rate, bit width, or to activate and deactivate—as a function of the fixed or predefined parameter 105—specific circuit parts that are needed for specific requirements only.

The detected or predefined parameter 105, on the basis of which the signal processing circuit 100a selects the resolution for providing the modulated analog transmit signal 101, may be, e.g., one of the following parameters mentioned by way of example:

Transmit output power, transmit gain, temperature, frequency, results of a monitor circuit, general network conditions, battery condition, or signal standard (such as GESM, UMTS, LTE or WLAN, frequency band). In accordance with further embodiments, it is also possible to take into account a combination of the above-mentioned parameters for adjusting the resolution when providing the modulated analog transmit signal 101. Specifically, a predefined parameter may be a signal standard and a data rate to be achieved, for example. A detected parameter, such as a transmit output power, a transmit gain, a temperature or a quality of the transmission channel, may be detected by the signal processing circuit 100a so as to vary, in response to the changing ambient conditions, the resolution when providing the modulated analog transmit signal 101.

In other words, various parameters are available for optimization:

1. Fixed parameters predefined by the radio standard and its various options such as data rate and frequency band, etc. They may be used for providing a basic setting of the signal processing circuit 100a, for example.
2. Environmental and technology parameters; said parameters are monitored (and detected) and serve to calibrate or readjust the circuit parts (the resolution of the digital circuit parts of the signal processing circuit 100a).

In summary, an idea of embodiments is to provide the individual assemblies with only so much current (power input) that transmit and receive functionalities (as will be described below by means of FIG. 1b) will be just sufficient.

For example, if below a specific output power (for the modulated analog transmit signal 101) the requirement placed upon the background noise is relaxed (for example in dBc), specific functions of the signal processing circuit 100a may be switched off or reconfigured (for example a lower sampling rate in digital-to-analog converters (DAC)) or PLL interpolators or noise shapers, or a lower bit width in digital filters).

For example, the signal processing circuit 100 may convert the digital transmit data signal 103 to an analog baseband signal and transfer same to the modulated analog transmit signal 101 by using a mixer and one or more amplifier stages. The modulated analog transmit signal 101 may therefore be a baseband signal that is up-converted to a carrier frequency and is amplified, for example.

In accordance with some embodiments, the digital transmit data signal 103 may be provided by a transmit data provider (e.g. a microcontroller), for example in the form of polar data (having an amplitude component and a phase component) or vector data (having an in-phase component and a quadrature component). The signal processing circuit 100a may receive the digital transmit data signal 103 and process it in accordance with the detected or predefined parameter 105 so as to obtain the modulated analog transmit signal 101. For example, the signal processing circuit 100a may adjust a data rate, a type of modulation, a frequency band and/or an amplification for the modulated analog transmit signal 101 and for this purpose comprise various circuit parts wherein the resolution is variable based on the detected or predefined parameter 105.

In accordance with some embodiments, the signal processing circuit 100a may be configured to detect a property of a transmission channel (such as a number and intensity of spurious signals) for the modulated analog transmit signal 101 and to select the resolution based on the detected property of the transmission channel when providing the modulated analog transmit signal 101.

In accordance with further embodiments, the signal processing means 100a may be configured to detect an output amplification and/or output power of the modulated analog transmit signal 101 so as to vary the resolution based on the detected output amplification and/or output power of the modulated analog transmit signal 101 when providing the modulated analog transmit signal 101.

In accordance with further embodiments, the signal processing circuit 100a may be configured to vary the resolution based on the signal standard to which the modulated analog signal 101 corresponds when providing the modulated analog transmit signal 101.

In accordance with further embodiments, the signal processing circuit 100a may be configured to detect its temperature (i.e. the temperature of the signal processing circuit 100 itself) or an ambient temperature so as to vary the resolution based on the temperature detected when providing the modulated analog transmit signal 101.

Figure 1B:
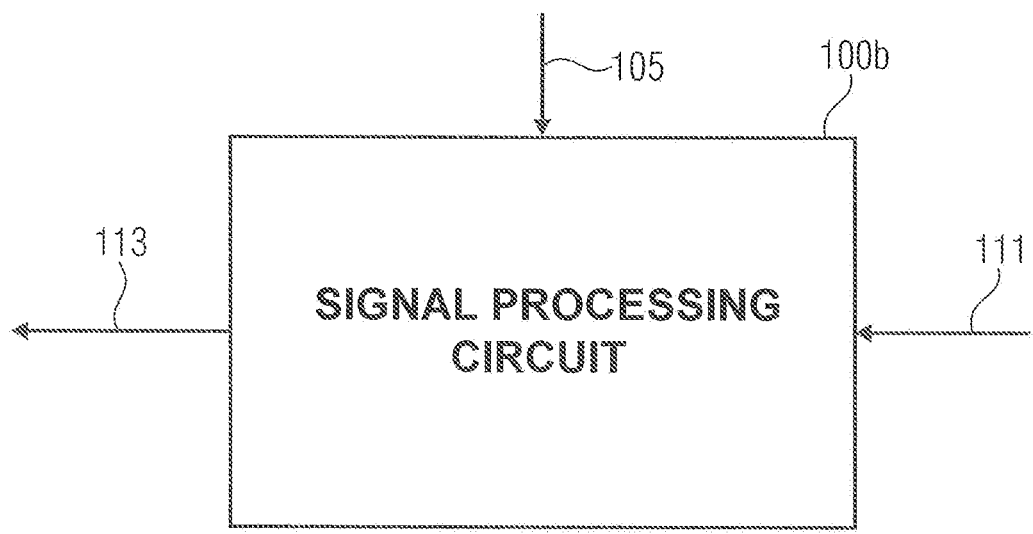

FIG. 1b shows a signal processing circuit 100b in accordance with a further embodiment of the present invention configured to provide a digital receive data signal 113 on the basis of a modulated analog receive signal 111. The signal processing circuit 100b is configured to vary a resolution based on a detected or predefined parameter 105 when providing the digital receive data signal 113.

The signal processing circuit 100b shown in FIG. 1b is on the basis of the same idea as the signal processing circuit 100a shown in FIG. 1a, namely on the idea that the requirements or preconditions for providing the digital data signal 113 are not constant but vary as a function of different parameters, and that, consequently, a resolution may be varied based on the detected or predefined parameter 105 when the digital receive data signal 113 is being provided so as to reduce a current consumption of the signal processing circuit 100b and thus increase an efficiency of the signal processing circuit 100b. The explanations that were given in the context of the signal processing circuit 100 with regard to adjusting the resolution and with regard to the various types of possible parameters shall similarly also apply to the signal processing circuit 100b and shall therefore not be repeated in the following. However, it shall be noted that in the signal processing circuit 100b, a receive gain for the modulated analog receive signal 111 as well as a linearity (which depends on the level of spurious signals, such as a blocker) of the modulated analog receive signal 111 may be taken into account as detected parameters for varying the resolution.

The signal processing circuit 100b may be configured to transfer, as opposed to the signal processing circuit 100a, the modulated analog receive signal 111 (which has been received via an antenna, for example) to the digital receive data signal 113. The signal processing circuit 100b may be configured, for example, to amplify, down-convert and demodulate the modulated analog receive signal 111 so as to provide the digital receive data signal 113 as a data stream, for example as a polar data stream or vector data stream.

In addition, a receive signal quality may be detected as a parameter 105; in this context, for example, an input power, an input spectrum, a type of encoding of the modulated analog receive signal 111 or general network conditions may be taken into account.

In accordance with further embodiments, the signal processing circuit 100b may be configured to detect a property of a transmission channel for the modulated analog receive signal 111 and select the resolution based on the detected property of the transmission channel when providing the digital receive data signal 113.

In accordance with further embodiments, the signal processing circuit 100b may be configured to vary the resolution based on the signal standard to which the modulated analog receive signal 111 corresponds when providing the digital receive data signal 113.

In accordance with further embodiments, the signal processing circuit 100b may be configured to detect an input amplification and/or an input power of the modulated analog receive signal 111 and vary the resolution based on the detected input amplification and/or input power of the modulated analog receive signal 111 when providing the digital receive data signal 113.

In accordance with further embodiments, the signal processing circuit 100b may be configured to detect its temperature or an ambient temperature so as to vary the resolution based on the detected temperature when providing the digital receive data signal 113.

Figure 1C:
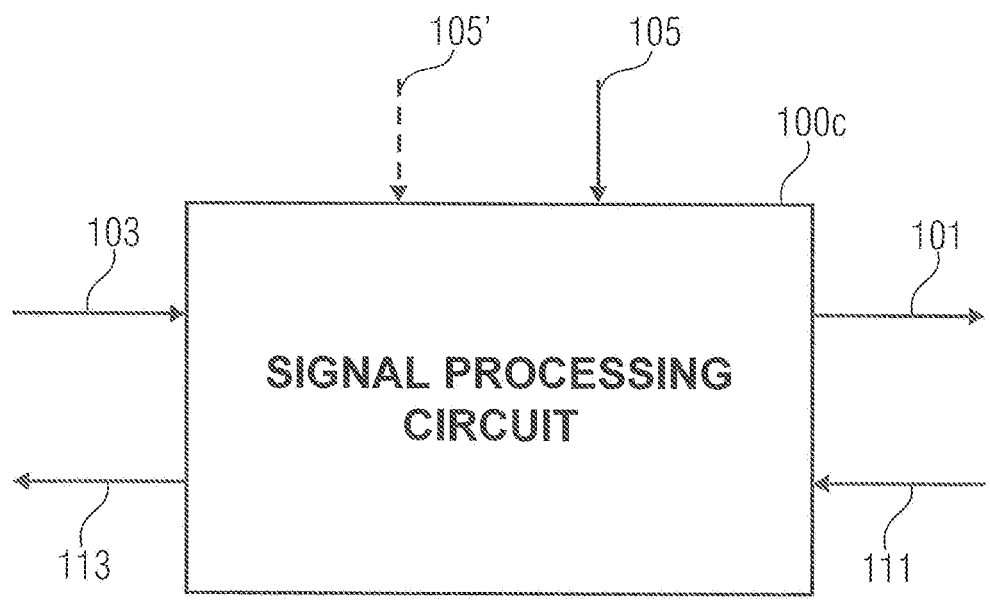

FIG. 1c shows a schematic representation of a signal processing circuit 100c or of a transceiver 100c in accordance with a further embodiment of the present invention. The signal processing circuit 100c is configured to provide a modulated analog transmit signal 101 on the basis of a digital transmit data signal 103 and provide a digital receive data signal 113 on the basis of a modulated analog receive signal 111. The signal processing circuit 100c is configured to vary a resolution based on a predefined or detected parameter 105 when providing the modulated analog transmit signal 101 and vary a resolution based on the detected or predefined parameter 105 or on a further detected or predefined parameter 105 when providing the digital receive data signal 113.

The signal processing circuit 100c shown in FIG. 1c thus combines the concept of the signal processing circuit 100a and of the signal processing circuit 100b in a common signal processing circuit 100c. Particularly in hand-held mobile radio units (such as cellular phones), transceivers are typically employed. By using the signal processing circuit 100c, shown in FIG. 1c, in such a transceiver and while exploiting the idea of the embodiments, increased efficiency may be achieved both in a transmit path of such a transceiver and in a receive path. As is shown in FIG. 1c, the resolution for providing the modulated analog transmit signal 101 based on a different parameter may be used as the resolution for providing the digital receive data signal 113. In accordance with further embodiments, the selection of the resolution for the provision of the modulated analog transmit signal 101 may be on the basis of a first set of parameters, and the selection of the resolution for the provision of the digital receive data signal 113 may be on the basis of a second set of parameters. Both sets of parameters may have an intersection, for example. For example, the first set of parameters may include a temperature, a signal standard and an output power for the modulated analog transmit signal 101, while the second set of parameters includes the temperature, the signal standard and a signal quality of the modulated analog receive signal 111. The resolutions and/or the digital precisions with which the modulated analog transmit signal 101 and the digital receive data signal 113 are provided may therefore vary based on the different sets of parameters.

It shall be noted that the above illustrations on the signal processing circuit 100a and the signal processing circuit 100b shall similarly also apply to the signal processing circuit 100c and will therefore not be repeated below.

One idea of the embodiment shown in FIG. 1c is that the signal processing circuit 100c, or the transceiver 100c, adapts to the changing transmit and receiving conditions such that the system requirements (in the provision of the modulated analog transmit signal 101 and in the provision of the digital receive data signal 113) are just about met and that, therefore, the circuit parts invariably operate with maximum efficiency. In order to be able to derive requirements for individual circuit blocks of the signal processing circuit 100c, the signal processing circuit 100c is configured to obtain knowledge of the present transmit and receiving conditions (in the form of a predefined or detected parameter 105 and/or of the further predefined or detected parameter 105').

Possible implementations of the signal processing circuits shown in FIGS. 1a and 1b will be described in the following by means of FIGS. 2a, 2b and FIG. 4. Even though transmitters and receivers will be described separately below, said concepts may also be realized, in accordance with an embodiment, in a common transceiver.

Figure 2A:
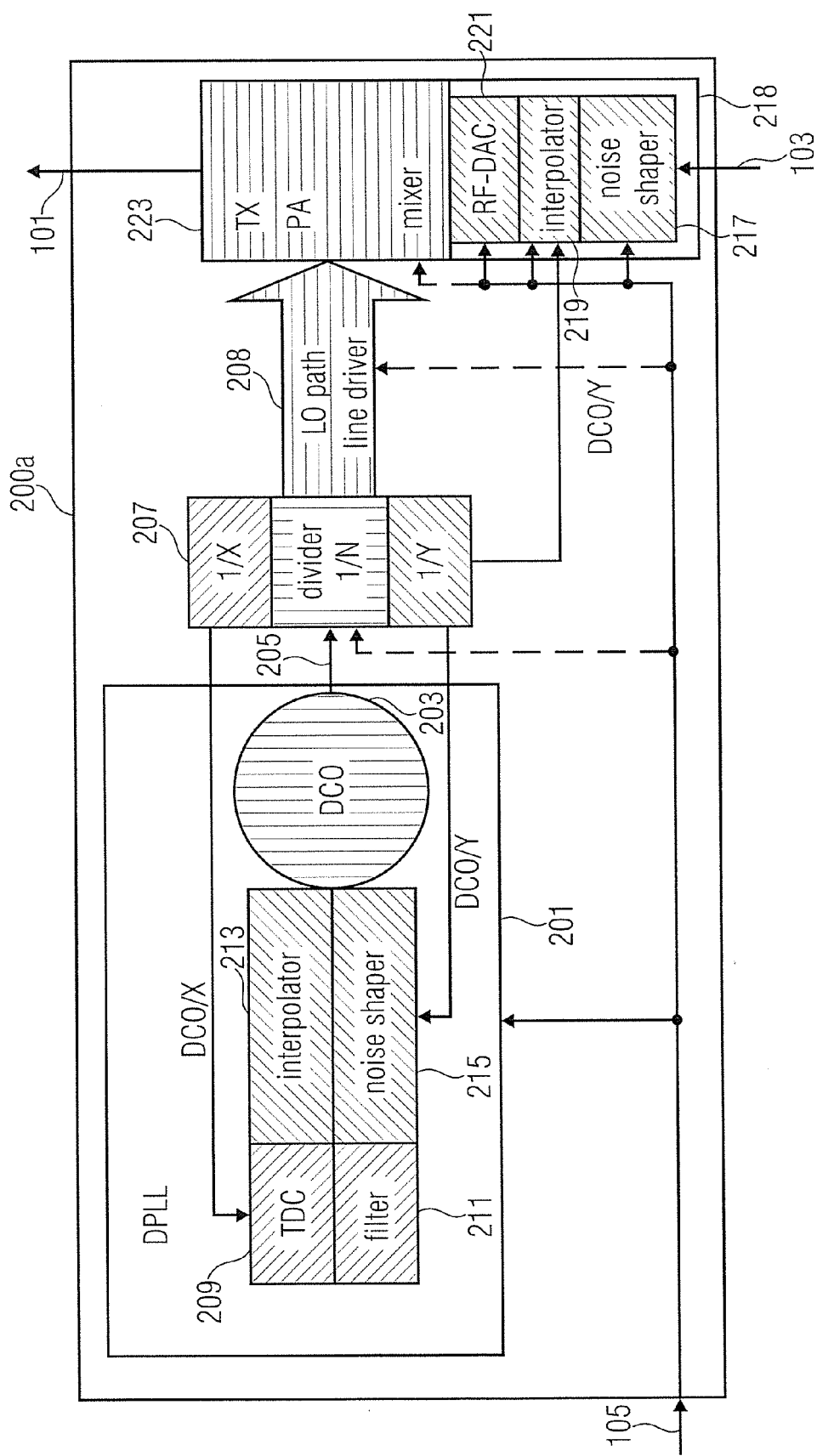
FIG. 2a shows a schematic representation of a possible implementation of the signal processing circuit shown in FIG. 1a by taking the example of a transmit polar modulator in accordance with an embodiment.

FIG. 2a shows a schematic representation of a signal processing circuit 200a in accordance with a further embodiment while using a concept of a polar modulator.

The signal processing circuit 200a shown in FIG. 2a is configured, just like the signal processing circuit 100a shown in FIG. 1a, to provide a modulated analog transmit signal 101 on the basis of a digital transmit data signal 103, and to vary a resolution based on a detected or predefined parameter 105 when providing the modulated analog transmit signal 101. The signal processing circuit 200a comprises a DPLL (digital phase lock loop) 201. The DPLL 201 comprises an oscillator 203 to provide an oscillator signal 205, on the basis of which the signal processing circuit 200a provides the modulated analog transmit signal 101. The oscillator signal 205 may be down-divided to various frequencies by using a division arrangement 207 so as to obtain different down-divided (in terms of frequency) versions of the oscillator signal 205, which may be used, for example, as a so-called synthesizer signal in a mixer of the signal processing circuit 201 or as a clock signal for digital circuit blocks of the signal processing circuit 200a.

The DPLL 201 is a digital component, and the signal processing circuit 200a is configured to select or vary a resolution of the DPLL 201 based on the detected or predefined parameter 105. For example, if an evaluation of the detected or predefined parameter 105 yields that, at a specific point in time, less strict requirements are placed on the modulated analog transmit signal 101, the signal processing circuit 200a may reduce the resolution of the DPLL 201, which may result in a less precise oscillation signal 205, which is not critical in this case, however, since the requirements placed upon the modulated analog transmit signal 101 are low and therefore can still be met. However, if the evaluation of the detected or predefined parameter 105 yields that, at a specific point in time, high requirements are placed upon the modulated analog transmit signal 101, the signal processing circuit 200a may increase the resolution of the DPLL 201 (set it to a maximum value, for example), which results in a higher precision of the oscillator signal 205 and, thus, in a better modulated analog transmit signal 101 (which has a higher linearity).

In other words, the signal processing circuit 200a is configured to vary the resolution of the DPLL 201 based on the detected or predefined parameter 105 (i.e., for example, based on fixed parameters that are predefined by the radio standard, and based on environmental or technology parameters) so as to reduce a current consumption of the DPLL 201 in case of low requirements. The signal processing circuit 200a may be configured to vary the resolution of the DPLL 201 only in such a manner that the requirements placed upon the modulated analog transmit signal 101 at any point in time are invariably (just about) met.

In accordance with some embodiments, the signal processing circuit 200a may be configured to vary an order, a bit rate and/or a clock rate of the DPLL 201 based on the detected or predefined parameter 105.

In the example shown in FIG. 2a, the DPLL 201 comprises a TDC (time-to-digital converter) 209, a filter 211, an interpolator 213 and a noise shaper 215. The TDC 209, the filter 211, the interpolator 213 and the noise shaper 215 are digital components, or digitally adjustable components, which may be adjusted by the signal processing circuit 200a based on the detected or predefined parameter 105. For example, the signal processing circuit 200a may be configured to activate or deactivate the noise shaper 215 based on the detected or predefined parameter 105, since it has been found that the noise shaper 215 (or a so-called noise shaper function of the noise shaper 215) is needed only at low output levels of the modulated analog transmit signal 101 in order to achieve a EVM (error vector magnitude) that may be applied. By switching off the noise shaper 215, current may thus be saved in the event of low output powers of the modulated analog transmit signal 101. In other words, the signal processing circuit 200a may be configured to detect an output power and/or an output amplification of the modulated analog transmit signal 101 (as the parameter 105) and activate or deactivate the noise shaper 215 in response to the detected output amplification and/or output power.

In accordance with further embodiments, the signal processing circuit 200a may also be configured to vary an order of the noise shaper 215 based on the detected or predefined parameter 105, since noise shaping of a relatively high order is not always required. By actively reducing the order of the noise shaper 215 based on the detected or predefined parameter 105, current may be saved.

In addition, the signal processing circuit 200a may also be configured to vary a clock rate of the noise shaper 215 based on the detected or predefined parameter 105.

By analogy with the noise shaper 215, the signal processing circuit 200a may be configured to vary an order, a bit width and/or a clock rate of the TDC 209, of the interpolator 213 and/or of the filter 211 of the DPLL 201 based on the detected or predefined parameter 105 as a resolution of the DPLL 201. In the embodiment shown in FIG. 2a, the oscillator 203 is a DCO (digitally controlled oscillator). The oscillator signal 205 is present at the output of the oscillator 203, which oscillator signal 205 is down-divided with the aid of the division arrangement 207 so as to provide it to the TDC 209 in a first down-divided version DCO/X and to provide it to the noise shaper 215 in a second down-divided version DCO/Y. On the basis of the down-divided versions DCO/X, DCO/Y of the oscillator signal 205, the DPLL 201 determines a digital correction value for the oscillator 203. When adjusting the resolution, the signal processing circuit 200a may vary a bit width and, thus, a resolution or a precision of this digital correction signal as well as a clock rate of the digital correction signal for updating the oscillator frequency 205 based on the predefined or detected parameter 105.

Figure 2B:
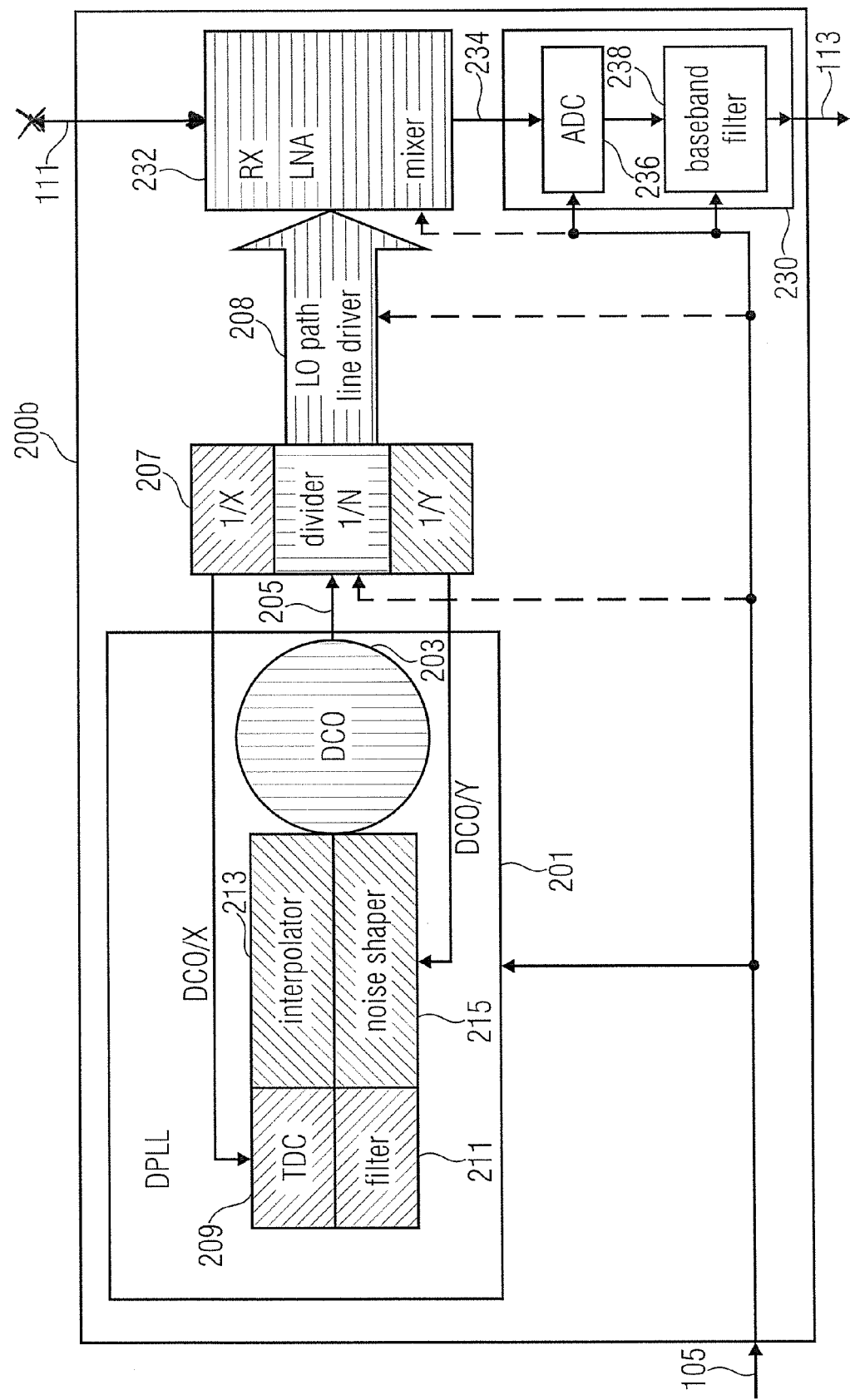
FIG. 2b shows a schematic representation of a possible implementation of the signal processing circuit shown in FIG. 1b by taking the example of a receive polar modulator in accordance with an embodiment.

The different types of hatching used in FIGS. 2a and 2b represent different frequency domains.

In accordance with further embodiments, the DPLL 201 may also comprise, instead of the DCO 203, a VCO (voltage controlled oscillator) having an additional digital-to-analog converter configured to convert the digital correction signal to a control voltage for the VCO. In this case, too, an order, a bit width and/or a clock rate of the digital-to-analog converter may be varied by the signal processing circuit 200a based on the detected and/or predefined parameter 105 for providing the control voltage for the VCO.

In summary, the following circuit parts, among others, may be adjusted in order to optimize the dissipation power in the DPLL 201:

Interpolators (specifically the order of the interpolators, the bit width and the clock rate), noise shapers (specifically the order of the noise shapers, the bit width and the clock rate).

In accordance with further embodiments, the signal processing circuit 200a may comprise a digital signal processing part 218, which, e.g., receives and pre-processes the digital transmit data signal 103 and converts it from digital to analog.

In accordance with further embodiments, the signal processing circuit 200a may be configured to vary a resolution of the signal processing in the digital signal processing part 218 based on the detected or predefined parameter 105. For example, the signal processing circuit 200a may vary an order, a bit width and/or a clock rate, i.e. both a temporal resolution and a digital resolution of the digital signal processing part 218, so as to reduce a current consumption of the digital signal processing part 218 in the event of relaxed requirements. In the embodiment shown in FIG. 2a, the signal processing part 218 comprises a noise shaper 217, an interpolator 219 and a digital-to-analog converter 221 (so-called RF-DAC). The signal processing circuit 200a may be configured to vary a resolution of each of the individual components of the signal processing part 218 based on the detected or predefined parameter 105. In addition, the signal processing circuit 200a may be configured to activate or deactivate the noise shaper 217 based on the detected or predefined parameter 105.

In the embodiment shown in FIG. 2a, the interpolator 219 of the digital signal processing part 218 receives the second down-divided version DCO/Y of the oscillator signal 205.

In accordance with further embodiments, the signal processing circuit 200a may additionally be configured to also vary a supply voltage and/or a biasing current (operating-point biasing current, or adaptive biasing current) based on the detected or predefined parameter 105. In other words, in accordance with further embodiments, it is not only possible to vary a digitally adjustable part (or its resolution) based on the detected or predefined parameter 105, but it is also possible to vary an analog part accordingly.

For example, the signal processing circuit 200a may be configured to vary, in the DCO 203 or a VCO, used instead, of the DPLL 201, a supply voltage of the circuit or a biasing current and/or a biasing voltage of the circuit (depending on the implementation) based on the detected or predefined parameter 105.

In addition, the various circuit parts are adjustable in one embodiment to optimize the dissipation power in an LO (local oscillator) path 208. For example, a supply voltage or a biasing current may be varied by line drivers in the LO path 208 based on the detected or predefined parameter 105. Moreover, a supply voltage or a biasing current of the divider arrangement 207 and/or the individual divider circuits of the divider arrangement 207 may also be varied based on the detected or predefined parameter 105.

Additionally, a supply voltage and/or a biasing current for an analog signal processing part 223 (e.g. comprising a PA (power amplifier)) and a mixer may also be varied based on the detected or predefined parameter 105.

In summary it may be stated that the TX polar modulator, as is shown using an example in FIG. 2a, is a complex circuit composed of sub-blocks that perform specific tasks in order to cover various points of a specification (standards).

The polar modulator shown in FIG. 2a comprises both digital and analog components, the signal processing circuit 200a being configured to vary a resolution of the digital components based on the detected or predefined parameter. As has already been mentioned, the signal processing circuit 200a may additionally be configured to vary control (for example a supply voltage or a biasing current) of the analog components of the signal processing circuit 200a based on the detected or predefined parameter 105.

In accordance with an embodiment, the following circuit parts may be adjustable, for example:

Interpolators, noise shapers, DCO, VCO, DAC, mixers, clock path (or LO path), supply voltage generation (power supply), baseband filters (both analog and digital), synthesizers (for generating a carrier frequency signal), power amplifiers as well as signal drivers (or line drivers).

In this context, the following parameters, among others (and not limited to same), may be taken into account in the adjustment:

Transmit output power, transmit gain, temperature, frequency, results of a monitor circuit, general system requirements and battery condition and/or supply voltage.

By means of an exemplary table, FIG. 3 shows that with OFDM (orthogonal frequency division multiplexing) signals, the signal quality that may be employed depends on the type of modulation used. As the order of the type of modulation increases (QAM 4, 16, 32, 64, . . . ), the requirement placed upon the phase and amplitude accuracy also increases. This directly makes itself felt in the requirements of DCO, VCO, circuits for LO generation such as the divider arrangement 207, drivers, etc.

The circuit parts shown in FIG. 2a are dimensioned for the worst case, i.e. they are dimensioned such that they will meet the requirements or standards even in the most adverse ambient conditions. However, since the type of modulation in modern mobile radio systems is constantly adapted as a function of the quality of the connection and as a function of the data transmission demand, the current consumption of the individual circuit parts described may be reduced—while using the embodiment shown in FIG. 2a in the event of a simple modulation—by varying the resolutions based on the ambient condition and technology specifications, i.e. based on the detected or predefined parameter 105.

The requirement, shown in FIG. 3, placed upon the transmit signal quality based on the type of modulation is defined to mean that the EVM and the relative constellation RMS error, averaged over sub-carriers, OFDM frames and packets, may not exceed the data rate-dependent value as is described in the central column of the table shown in FIG. 3.

FIG. 2b shows a schematic representation of a signal processing circuit 200b in accordance with a further embodiment of the present invention. The signal processing circuit 200b shown in FIG. 2b is a possible implementation of the signal processing circuit 100b shown in FIG. 1a, using the example of a polar modulator.

The signal processing circuit 200b shown in FIG. 2b differs from the signal processing circuit 200a shown in FIG. 2a in that it is configured to provide a digital receive data signal 113 on the basis of a modulated analog receive signal 111 and to vary a resolution based on a detected or predefined parameter 105 when providing the digital receive data signal 113. Just like the signal processing circuit 200a, the signal processing circuit 200b comprises the DPLL 201 and the divider arrangement 207. Just like the signal processing circuit 200a, the signal processing circuit 200b may be configured to vary a resolution of the DPLL 201 based on the detected or predefined parameter 105. In addition, the signal processing circuit 200b also comprises the divider arrangement 207 and the LO path 208, and the signal processing circuit 200b may be configured to vary a supply voltage and/or a supply current (or an operating-point current) of the divider arrangement 207 and of the LO path 208 based on the detected or predefined parameter 105.

As was already mentioned above, the signal processing circuit 200b differs from the signal processing circuit 200a in that it provides the digital receive data signal 113. To this end, the signal processing circuit 200b comprises a digital signal processing part 230. In addition, the signal processing circuit 200b comprises an analog signal processing part 232. The analog signal processing part 232 is configured to receive and amplify the modulated analog receive signal 111 and provide it as an analog baseband signal 234 to the digital signal processing part 230. The digital signal processing part 230 is configured to convert the analog baseband signal 234 from analog to digital, filter and optionally demodulate it so as to obtain the digital receive data signal 113. The signal processing circuit 200b may vary a resolution of the digital signal processing part 230 based on the predefined or fixed parameter 105.

In accordance with some embodiments, the digital signal processing part 230 may comprise an analog-to-digital converter (ADC) 234 as well as a digital baseband filter 238. The signal processing circuit 200b may vary, for example, an order, a bit rate and/or a clock rate of the ADC 236 and/or of the baseband filter 238 based on the detected or predefined parameter 105 so as to reduce a current consumption of the digital signal processing part 230.

In accordance with further embodiments, the signal processing circuit 200b may also vary a supply voltage and/or a biasing current of the analog signal processing part 232 based on the detected or predefined parameter. For example, the analog signal processing part 232 may comprise an input amplifier (LNA—low noise amplifier) and a mixer, and the signal processing circuit 200b may vary a supply voltage and/or a biasing current for the LNA or the mixer based on the detected or predefined parameter 105.

In the signal processing circuit (or receiver) 200b shown in FIG. 2b, the components consisting of the sub-blocks of LNA, mixer, DC, DPLL, LO path and baseband filter, have to meet different requirements, depending on the receive scenario (based on the detected or predefined parameter 105).

The requirements in terms of phase noise (phase jitter) at different frequencies (differently located frequencies) are dependent on the radio standard, the frequency band and the receiving conditions. For example, if the receiving conditions are good (no adjacent channel interference), the phase noise of the DCO 203 and of the LO path may be degraded by current reduction and by reducing the resolution (e.g. of the DPLL 201). It is also above a specific input signal level that the requirements placed upon the background noise (noise figure) decrease, so that in this case, the LNA and mixer circuit blocks may be switched to a current-saving mode.

In addition, it has been found that SNR (signal-to-noise ratio) requirements of the receiver also depend on the data rate transmitted. In the signal processing circuit 200b (or receiver) shown in FIG. 2b, the SNR behavior is largely determined by the phase noise of the DPLL 201. With reduced SNR requirements (e.g. due to a lower data transmission rate), the DPLL 201 may be switched to a current-saving mode. In other words, the signal processing circuit 200b may be configured to reduce a resolution of the DPLL 201 in the event of a lower data rate for the modulated analog receive signal 111. For example, the signal processing circuit 200b may be configured to reduce, when the data rate of the modulated analog receive signal 111 is reduced, an order, a bit width and/or a clock rate of the DPLL 201 (or of individual components of the DPLL 201).

Those circuit parts of the signal processing circuit 200b that may be used for demodulation (also referred to as synthesizers) are dimensioned such that the transmission standard (data rate, type of encoding) having the highest requirements may be met. A maximum current consumption of the DPLL 201 and of the LO path 208 is thus determined by the highest requirements. In the event of relaxed receiving conditions, the requirements placed upon the circuit blocks will decrease. The circuit blocks will then be reconfigured by the signal processing circuit 200b such that they will exhibit more noise, for example, but in return will involve less current while still meeting the requirements needed at the respective point in time.

In other words, the synthesizers that may be used for demodulation are dimensioned such that the receive signal 111, which is often weak, may be received with a sufficient level of quality even in the presence of much stronger adjacent spurious signals. Such a scenario comprising a weak receive signal and much stronger adjacent spurious signals determines the maximum current consumption of circuits such as the DC 203 or a VCO. In the event of relaxed receiving conditions, the requirements placed upon the circuit blocks will decrease, and the circuit blocks may therefore be reconfigured by the signal processing circuit 200b in a current-saving manner by varying the resolution (and in some embodiments by varying a supply voltage and/or a biasing current).

Even though the signal processing circuits shown in FIGS. 2a and 2b are of the polar modulator type, the concept shown may also be applied to vector modulators.

Figure 4:
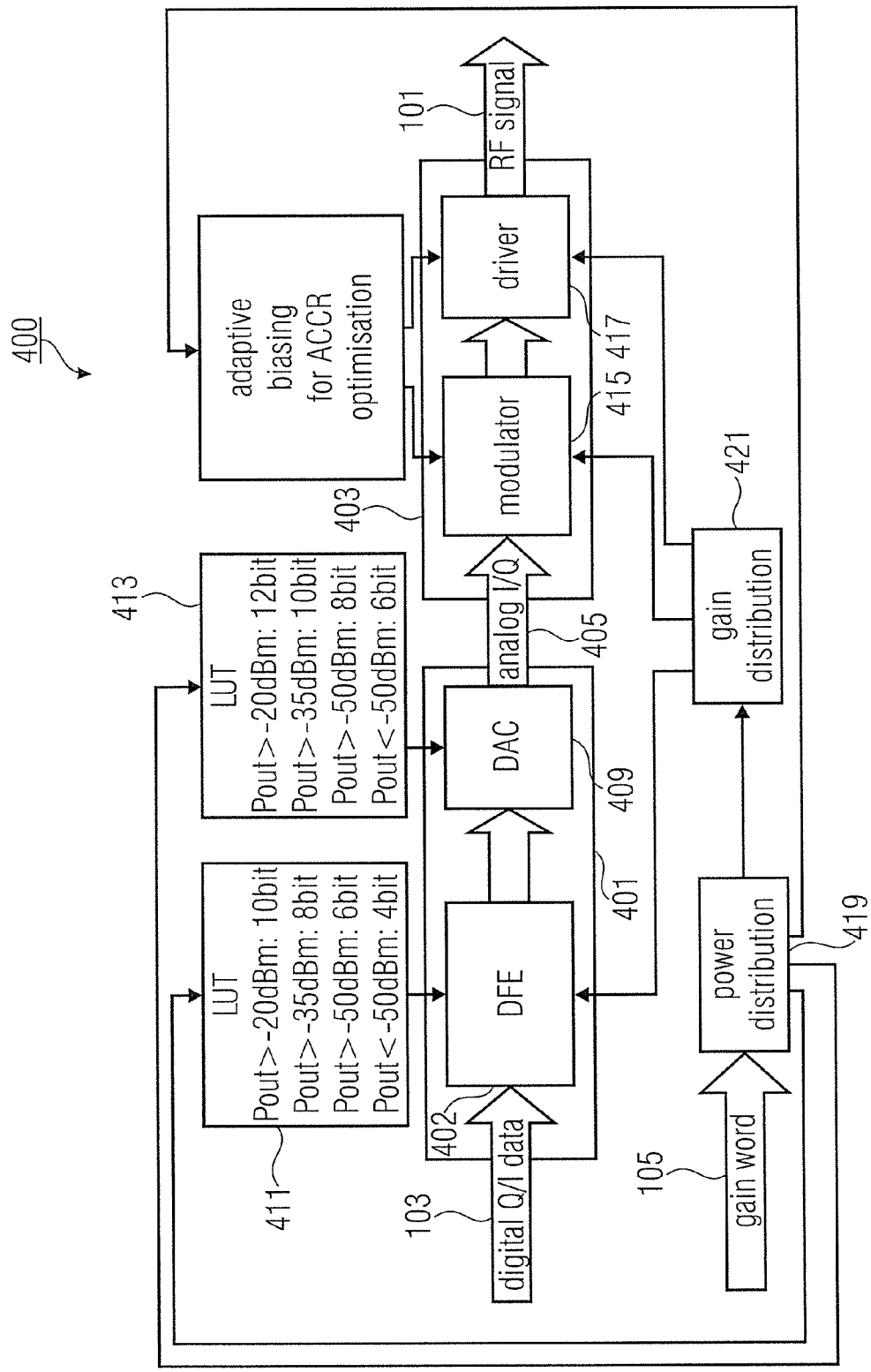
FIG. 4 shows a schematic representation of a signal processing circuit in accordance with a further embodiment.

FIG. 4 shows a schematic representation of a signal processing circuit 400 in accordance with a further embodiment by using the example of a transmit vector modulator. The signal processing circuit 400 shown in FIG. 4 forms a possible implementation of the signal processing circuit 100a shown in FIG. 1a. Just like the signal processing circuit 100a, the signal processing circuit 400 is also configured to provide a modulated analog transmit signal 101 on the basis of a digital transmit data signal 103. In addition, the signal processing circuit 400 is configured to vary a resolution based on a detected or predefined parameter 105 when providing the modulated analog transmit signal 101. In the vector modulator concept shown in FIG. 4, the signal processing circuit 400 may be configured to receive the digital transmit data signal 103 in the form of a data stream, for example comprising an in-phase component (I component) and a quadrature-phase component (Q component).

The signal processing circuit 400 comprises a digital signal processing part 401 and an analog signal processing part 403. The digital signal processing part 401 is configured to preprocess the digital transmit data signal 103 and adapt it to the desired signal standard accordingly, and perform a digital-toanalog conversion so as to provide an analog transmit data signal 405 to the analog signal processing part 403.

The analog signal processing part 403 is configured to modulate and amplify the analog transmit data signal 405 in accordance with the signal standard desired so as to obtain the modulated analog transmit signal 101.

As has already been described, the signal processing circuit 400 is configured to vary a resolution when providing the modulated analog transmit signal 101. As has already been explained by means of the previous embodiments, a resolution in the present application relates to digitally adjustable, or digital, circuit parts. A change in the resolution by the signal processing circuit 400 therefore results in a change in the precision of the digital signal processing part 401. The signal processing circuit 400 is therefore configured to vary a precision based on the detected or predefined parameter 105 when providing the analog transmit data signal 405.

In the embodiment shown in FIG. 4, the signal processing circuit 400 is configured to vary a bit width of the digital signal processing part 401 based on an gain word (which forms the predefined parameter 105). In addition, the signal processing circuit 400 is configured to perform adaptive biasing of the analog signal processing part 403 based on the gain word 105.

It has been found that a linearity of a TX chain, or transmit chain, as is shown in FIG. 4 comprising the digital signal processing part 401 and the analog signal processing part 403 is determined by the requirements of the spectral mask. In this context, one distinguishes between ACLR (adjacent channel leakage ratio) and SEM (spectral emission mask). The ACLR requirements are defined in dBc (relative) for the upper level range (of the modulated analog transmit signal 101) and in dBm (absolute) for the lower level range (of the modulated analog transmit signal 101). It has been found that for typical RF circuits, a potential for current savings results from implementing level-dependent linearity. By varying the adaptive biasing of the analog signal processing part 403 based on the gain word 105 and, thus, based on the level of the modulated analog transmit signal 101, the signal processing circuit 400 implements such level-dependent linearity so as to save current, particularly in the upper level range of the power of the modulated analog transmit signal 101 (see also FIGS. 5a-6).

Moreover, it has been found that compliance with the spectrum mask (SEM), which, depending on the frequency locations, is subdivided into different areas, also allows possibilities of saving current. Since the mask (SEM) is defined in dBm (absolute level), current may be saved in the lower level range, in particular. In the signal processing circuit 400 shown in FIG. 4, this finding is implemented in that in the specific case, the bit width is reduced accordingly in the digital signal processing part 401 of the transmit filter chain (of the signal processing circuit 400) upon power reduction (i.e. with a smaller gain word 105).

Figure 5A:
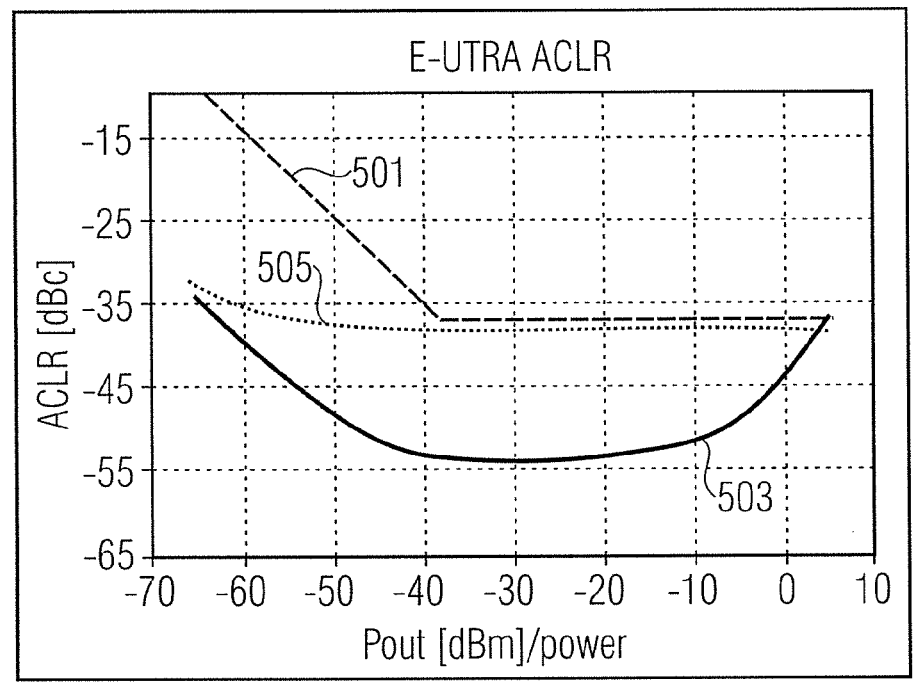
FIG. 5a shows a diagram for presenting a comparison between typical and optimized ACLR behaviors of a transmitter for changing output levels.

FIG. 5a shows the ACLR behavior of a typical (conventional) transmitter with changing output levels. The diagram in FIG. 5a shows an ACLR requirement curve 501 for the ACLR to be complied with as well as an actual curve 503 of the ACLR of the conventional transmitter. It becomes clear that there is a high reserve between the ACLR requirement curve 501 and the actual curve 503 so that the requirement can still be met even at a high level of the modulated analog transmit signal 101.

FIG. 5a additionally shows an optimized ACLR behavior of the signal processing circuit 400 with changing output levels. What is additionally shown is an actual curve 505 of the ACLR of the signal processing circuit 400 while using the adaptive biasing based on the gain word 105. It becomes clear that the reserve between the ACLR requirement curve 501 and the actual curve 505 is clearly smaller than the reserve between the ACLR requirement curve 501 and the actual curve 503, since, due to the adaptive biasing, the linearity is constantly selected such that it will just about meet the requirements. Moreover, it becomes clear from FIG. 5a that the current (for the analog signal processing part 403) is reduced particularly in the upper power range (e.g. larger than −40 dBm transmitting power for the modulated analog transmit signal 101), when assuming the maximum output power, so as to just about meet the linearity requirements (predefined by the ACLR requirement curve 501).

Figure 5B:
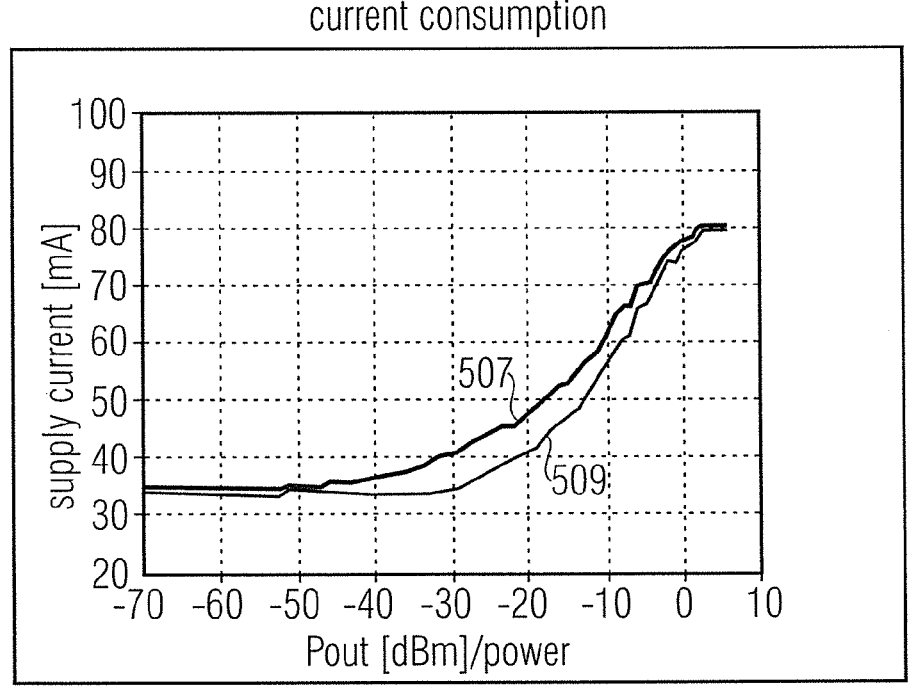

The resulting current savings are shown in a diagram in FIG. 5b, a curve 507 showing the current consumption of a typical transmitter (e.g. with the actual ACLR curve 503), and a curve 509 showing the current consumption of an optimized transmitter (of the signal processing circuit 400 with the actual ACLR curve 505). The current savings that additionally results from varying the resolution of the digital signal processing part 401 is not yet shown in this diagram in FIG. 5b. It becomes clear from FIG. 5b that appreciable current savings are achieved at a power above −40 dBm (see actual curve 509).

In summary, the signal processing circuit 400 is configured to reduce the supply voltage or the biasing current of the analog signal processing part 403—in a predefined upper transmitting power range (e.g. >−40 dBm) of the modulated analog transmit signal 101—when the transmitting power of the modulated analog transmit signal 101 increases, such that the actual curve 505 of the ACLR of the signal processing circuit 400 will be below (at least in the upper transmitting power range) below the ACLR requirement curve 501.

In accordance with further embodiments, the signal processing circuit 400 may be configured to vary the supply voltage or the biasing current (or, generally, the operating point) of the analog signal processing part 403 such that a difference between the actual curve 505 of the ACLR of the signal processing circuit 400 and the requirement curve 501 for the ACLR is minimized (e.g. amounts to a maximum of 10 dBc) in the upper transmitting power range. In an ideal case, the actual curve 505 of the ACLR of the signal processing circuit 400 will correspond to the ACLR requirement curve 501.

In addition to the adaptive biasing for the analog signal processing part, the signal processing circuit 400 will also vary the bit width of the digital signal processing part 401 based on the gain word 105 such that the requirements placed upon the SEM will be constantly met while a current consumption of the digital signal processing part 401 will be kept to a minimum.

Figure 6A:
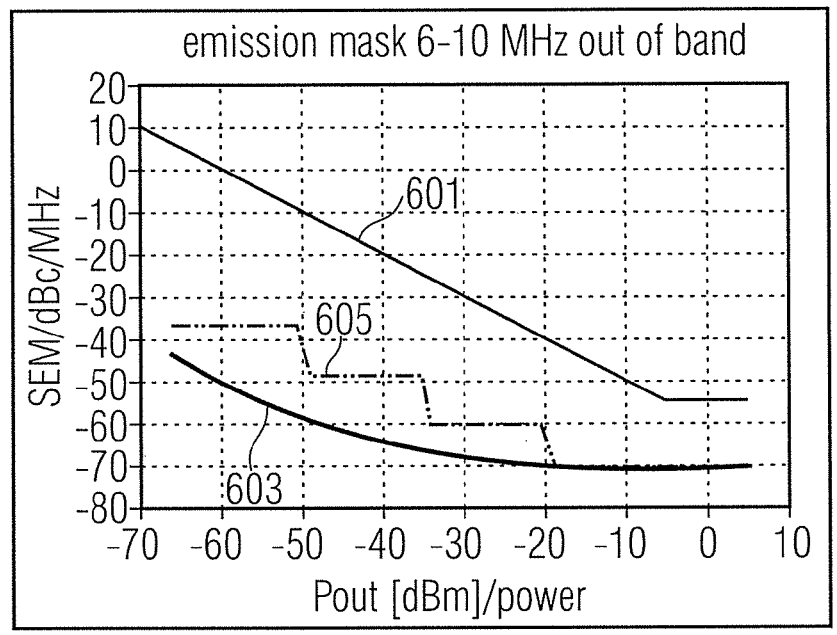
FIG. 6a shows a diagram for presenting the curve of the spectral mask (SEM) without and with optimization of the bit width in the digital part.

FIG. 6a shows an SEM requirement curve 601 and an actual curve 603 of the SEM without optimization in a conventional transmitter. Here, one may recognize a reserve of up to 40 dB between the actual curve 603 and the SEM requirement curve 601.

Additionally, FIG. 6a shows an actual curve 605 of the SEM having a bit-width reduction, which actual curve 605 depends on the transmit level, as is performed by the signal processing circuit 400. The stepped shape of the actual curve 605 clearly shows how the bit width of the digital signal processing part 401 is increased as the level of the modulated analog transmit signal 401 increases, so as to meet the requirements of the SEM, which are predefined by the SEM requirement curve 601.

It becomes clear from FIG. 6a that, particularly in the lower transmitting power range (e.g. smaller than −20 dBm of the transmitting power of the modulated analog transmit signal 101), the bit width of the digital part and/or of the digital signal processing part 401 (and of a DAC) of the transmit filter chain (of the signal processing circuit 400) is reduced accordingly when the power of the modulated analog transmit signal 101 is reduced. In the transmitting power range larger than −20 dBm, the actual curve 605 corresponds to the actual curve 603 of the transmitter not optimized in terms of bit width, since in this case the maximum bit width of the digital signal processing part 401 is utilized in order to be able to comply with the strict requirements in the high transmitting power range for the modulated analog transmit signal 101.

In other words, the signal processing circuit is configured to reduce—in a predefined lower transmitting power range (e.g. smaller than −20 dBm transmitting power) of the modulated analog transmit signal 101 when there is a decrease in the transmitting power of the modulated analog transmit signal 101—the bit width of the digital signal processing part 401 of the signal processing circuit 400 such that the actual curve 605 of the SEM in the lower transmitting power range is below the requirement curve 601 for the SEM.

In addition, the signal processing circuit 400 may be configured to increase the bit width of the digital signal processing part 401 in the event of an increase in the transmitting power when the actual curve 605 of the SEM approximates the requirement curve 601.

The signal processing circuit 400 may further be configured to vary the bit width of the digital signal processing part 401 such that in the lower transmitting power range, a difference between the actual curve 605 of the SEM and the requirement curve 601 is minimized (amounts to a minimum of 0 dB in the ideal case). In one embodiment, this difference may amount to a minimum of 1 dB and to a maximum of 35 dB.

In practical terms, a stepped curve results on account of the bit switching, here at a resolution of 12 dB, which corresponds to a switching of 2 bits. In accordance with further embodiments, the efficiency of switching in steps of 1 bit may improve even further (finer stepping). A further approximation of the actual curve 605 of the SEM to the requirement curve 601 may be achieved, in accordance with further embodiments, by a further reduction of the bit width, which has been dispensed with in the presentation shown.

A lower limit of the lower transmitting power range, within which the signal processing circuit 400 varies the bit width of the digital signal processing part 401, is determined by the minimum output power that may be used. The upper limit results from the transition of the requirement curve to the horizontal range (−5 dBm in the actual curve 601).

In one embodiment, the lower limit may amount to −60 dBm, for example, and an upper limit of the lower transmitting power range may amount to −5 dBm, for example.

Figure 6B:
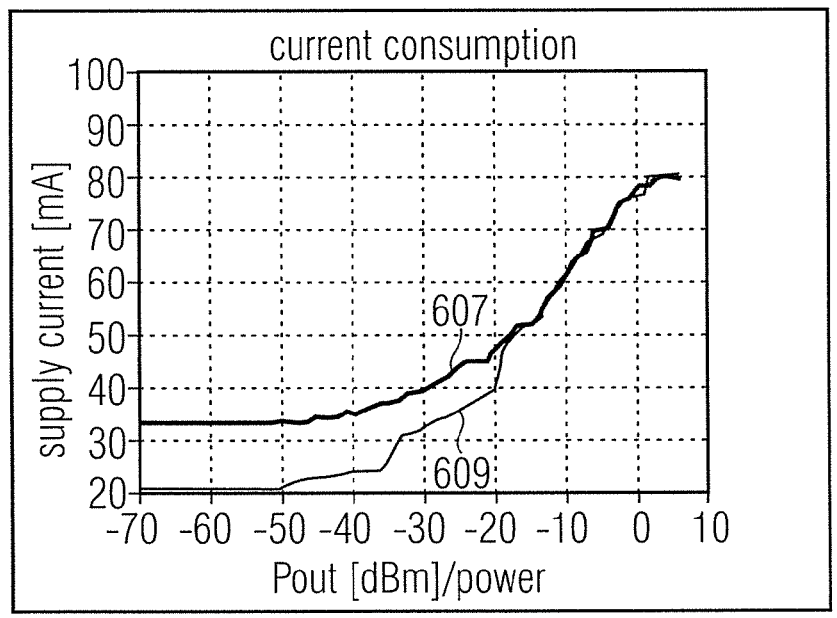
FIG. 6b shows a diagram for presenting a comparison of current consumptions of a typical transmitter exhibiting the curve, shown in FIG. 6a, of the spectral mask without optimization, and of a bit width-optimized transmitter in accordance with an embodiment with the curve, shown in FIG. 6a, of the spectral mask with optimization (SEM)

In a diagram, FIG. 6b shows a comparison in the power consumptions of the typical transmitter (with the actual curve 603) and the bit width-optimized transmitter (of the signal processing circuit 400) with the actual curve 605, shown in FIG. 6a. The current consumption of the typical transmitter is represented by a curve 607, whereas the current consumption of the bit width-optimized transmitter, i.e. of the signal processing circuit 400, is depicted by a curve 609. It is clear that, in particular in the lower transmitting power range <−20 dBm, a marked current reduction may be achieved as compared to the typical transmitter. Due to the stepped shape of the curve 609, one may recognize the increase and decrease in the bit width of the digital signal processing part 401 based on the transmit level.

The diagram in FIG. 6b shows only the reduction in the current consumption due to the variation of the resolution (to be more precise, of the variation of the bit width) of the digital signal processing part 401 based on the gain word 105, but does not show the adaptive biasing.

Figure 7:
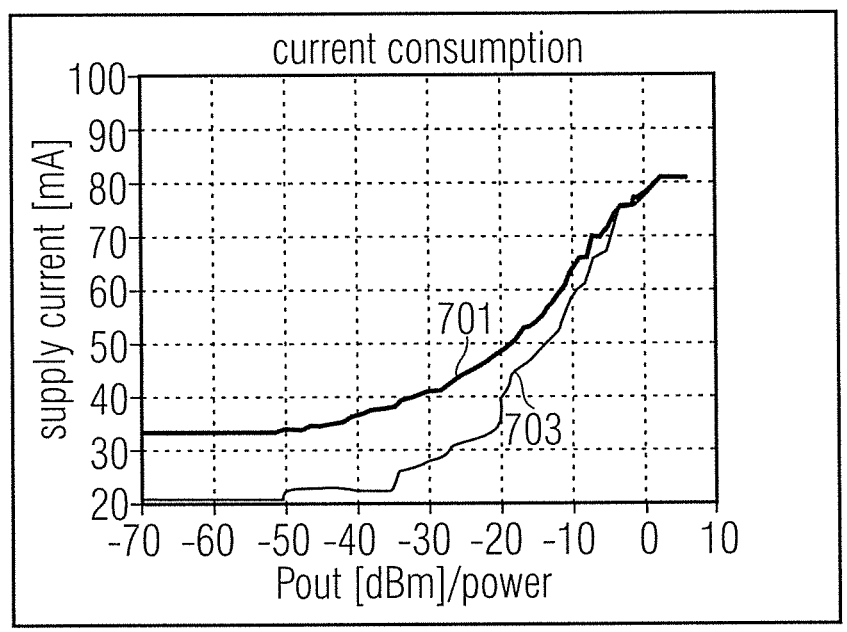
FIG. 7 shows a diagram for presenting a current consumption comparison between a typical transmitter without linearity optimization and a transmitter with ACLR optimization and bit-width reduction in accordance with an embodiment.

FIG. 7 shows a combination of both diagrams 5b and 6b and, thus, a combination of an ACLR optimization (of the adaptive biasing of the analog signal processing part 403) and a bit width reduction (of the variation of the resolution of the digital signal processing part 401). The comparison of a current consumption curve 701 for a conventional transmitter and a current consumption curve 703 of the signal processing circuit 400 while using the combination of ACLR optimization and bit width reduction clearly shows that a current reduction is achieved across the entire output power range as compared to the standard implementation.

In the area of overlap (between −40 and −20 dBm), where both analog and digital optimization are effective, current savings are particularly large. This is significant since in use, the average transmitting power at the antenna amounts to about 0 dBm, which corresponds to a transceiver power of about −25 to −20 dBm.

For varying the bit width of the digital signal processing part 401, the signal processing circuit 400 may comprise a table (for example a so-called lookup table—LUT) which contains a plurality of table pairs, each value of the gain word 105 or at least specific areas of the gain word 105 having associated therewith a bit width to be selected of the digital signal processing part 401.

In accordance with further embodiments, the digital signal processing part 401 of the signal processing circuit 400 may comprise a so-called DFE (digital front end) 407 and a DAC 409. The DFE 407 and the DAC 409 may comprise different bit widths, so that the signal processing circuit 400 does not adjust a bit width for the entire digital signal processing part 401, but adjusts a bit width of its own in each case for the individual components of the digital signal processing part 401. Therefore, the signal processing circuit 400 may comprise, e.g., a first LUT 411 for adjusting the bit width of the DFE 407 based on the gain word 105, and a second LUT 413 for adjusting the bit width of the DAC 409 based on the gain word 105.

Each of the LUTs 411, 413 may be adapted to the associated component of the digital signal processing part 401. For example, a maximum bit width of the DFE 407 may be 10 bits, which is set when there is a transmitting power Pout X larger than −20 dBm, whereas a maximum bit width of the DAC 409 may be 12 bits, which is set when there is a transmitting power Pout larger than −20 dBm.

In other words, the signal processing circuit 400 comprises the tables 411, 413 having a plurality of values of the transmitting power of the modulated analog transmit signal 101 or ranges of values of the transmitting power of the modulated analog transmit signal 101. In the tables 411, 413, each value or each range of values of the transmitting power of the modulated analog transmit signal 101 has a bit width of the DFE 407 and of the DAC 409 associated with it, said bit width having to be set. The signal processing circuit 400 is configured to set the bit width of the DFE 407 and of the DAC 409 on the basis of the tables 411, 413 and based on the transmitting power of the modulated analog transmit signal 101. In accordance with further embodiments, the signal processing circuit 400 may also comprise a common table for the entire digital signal processing part 401.

The bit widths in the tables 411, 413 are selected such that the requirements placed upon the spectral mask (SEM) are complied with at the respective associated transmitting power of the modulated analog transmit signal 101.

In addition, the analog signal processing part 403 may comprise a modulator 415 and a driver 417. The signal processing circuit 400 may set, based on the gain word 105, both an operating point (i.e. a supply voltage or a biasing current, for example) of the modulator 415 and an operating point (i.e. a supply voltage or a biasing current, for example) of the driver 417.

In accordance with further embodiments, the amplifier circuit 400 may be configured to distribute the amplification, which is predefined by the gain word 105, to the individual steps (to the digital signal processing part 401 and to the analog signal processing part 403) by means of a power adjuster 419 and an amplification distributor 421. In other words, a gain word 105 is transmitted to the signal processing circuit 400 (e.g. as part of a transceiver) in addition to the data stream (digital Q/I data, the digital transmit data signal 103). The gain word 105 determines the transmitting power. In the chip, the gain distribution (amplification distribution) to the individual steps is performed accordingly.

In summary, FIG. 4 shows a transmit circuit comprising a digital and an analog part (vector modulator type) with an optimization of the power input.

In summary, it has been found that in the transmit path (baseband filter, modulator, output driver), the power input is largely determined by the linearity requirements of the circuit blocks. In this context, the requirements placed upon the spectral mask (SEM, spectral emission mask) and upon the adjacent channel leakage ratio (ACLR) are to be met. Thus, different requirements result for the circuit blocks for the upper and lower transmitting power ranges. In the upper range, level-dependent linearity may be realized such that the circuit blocks (the analog signal processing part 403) consume just as much current as is useful to comply with ACLR. In the lower transmitting power range, the requirements are reduced such that the bit widths in the digital filter (in the digital signal processing part 401) may be reduced, which saves current here, too. In this manner, current savings may be achieved across the entire transmitting power range; in the lower transmitting power range, it is mainly the resolution of the signal processing circuit 400 that is varied, whereas in the upper transmitting power range, it is the supply voltage or biasing currents of the components of the analog signal processing part 403 that are varied.

In accordance with further embodiments, the concept shown in FIG. 4 may also be applied to the polar modulator architecture.

A further embodiment provides a method of providing a modulated analog transmit signal on the basis of a digital transmit signal comprising a step of varying a resolution when providing the modulated analog transmit signal based on a detected or predefined parameter. This method may be carried out by the signal processing circuits 100a, 100c, 200a, 400, for example.

A further embodiment provides a method of providing a digital receive data signal on the basis of a modulated analog receive signal comprising a step of varying a resolution when providing the digital receive signal based on a detected or predefined parameter. This method may be carried out by the signal processing circuits 100b, 100c, 200b, for example.

In summary, embodiments provide methods and devices for optimizing the power input in RF transmitter, RF receiver, RF transceiver circuits (radio frequency transmitter, radio frequency receiver, radio frequency transceiver circuits) under changing operating conditions.

Embodiments enable optimization of the dissipation power in a DPLL and optimization of the dissipation power in an LO path.

In addition, by combining the variation of a resolution in a digital part of a signal processing circuit and the variation of an operating point of an analog part of the signal processing circuit, embodiments enable reduced power input across an entire transmitting power range and receiving power range.

Further embodiments comprise internal monitor structures to detect parameters, on the basis of which a resolution when providing a modulated analog transmit signal or when providing a digital receive data signal is varied.

Even though some aspects were described in the context of a device, it is understood that the aspects also represent a description of the corresponding method, so that a block or a component of a device is also to be understood as a corresponding method step or as a feature of a method step. By analogy therewith, aspects that have been described in connection with or as a method step also represent a description of a corresponding block or detail or feature of a corresponding device. Some or all of the method steps may be performed by a hardware apparatus (or while using a hardware apparatus), such as a microprocessor, a programmable computer or an electronic circuit, for example. In some embodiments, some or several of the most important method steps may be performed by such an apparatus.

Depending on specific implementation requirements, embodiments of the invention may be implemented in hardware or in software. Implementation may be effected while using a non-transitory digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a non-transitory machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a non-transitory digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be effected electronically or optically, for example. The receiver may be a computer, a mobile unit, a storage device, or a similar device, for example. The device or the system may include a file server for transmitting the computer program to the receiver, for example.

In some embodiments, a programmable logic device (e.g. a field-programmable gate array, an FPGA) may be used for performing some or all of the functionalities of the methods described herein. In some embodiments, a field-programmable gate array may cooperate with a microprocessor to perform any of the methods described herein. Generally, in some embodiments the methods are performed by any hardware device. The latter may be universally employable hardware such as a computer processor (CPU) or a hardware specific to the method, such as an ASIC, for example.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A signal processing circuit for providing a modulated analog transmit signal on the basis of a digital transmit data signal;
the signal processing circuit comprising one or more digital circuit components and one or more analog circuit components, the signal processing circuit being configured to vary a resolution of at least one of the one or more digital circuit components in dependence on a detected or predefined parameter when providing the modulated analog transmit signal,
wherein the detected or predefined parameter comprises a parametric or environmental condition associated with the signal processing circuit.

2. The signal processing circuit as claimed in claim 1, further configured to provide a digital receive data signal on the basis of a modulated analog receive signal and to vary a resolution in dependence on the detected or predefined parameter or on a further detected or predefined parameter when providing the digital receive data signal.

3. The signal processing circuit as claimed in claim 1, configured to vary a digital resolution or a temporal resolution when providing the modulated analog transmit signal or the digital receive data signal.

4. The signal processing circuit as claimed in claim 1, comprising an analog-to-digital converter or a digital-to-analog converter and configured to vary an order, a bit width or a clock rate of the analog-to-digital converter or of the digital-to-analog converter in dependence on the detected or predefined parameter or on the further detected or predefined parameter.

5. The signal processing circuit as claimed in claim 1, which comprises a digital phase lock loop comprising an oscillator for providing an oscillator signal;
the signal processing circuit being configured to provide the modulated analog transmit signal on the basis of the oscillator signal or to provide the digital receive data signal on the basis of the oscillator signal; and
to vary an order, a bit width or a clock rate of the digital phase lock loop in dependence on the detected or predefined parameter or in dependence on the further detected or predefined parameter.

6. The signal processing circuit as claimed in claim 5, wherein the digital phase lock loop comprises a noise shaper; and
the signal processing circuit being configured to activate or deactivate the noise shaper in dependence on the detected or predefined parameter or in dependence on the further detected or predefined parameter.

7. The signal processing circuit as claimed in claim 5, further configured to vary a supply voltage or a biasing current of the oscillator in dependence on the detected or predefined parameter or in dependence on the further detected or predefined parameter.

8. The signal processing circuit as claimed in claim 1, the signal processing circuit being configured to detect a property of a transmission channel for the modulated analog transmit signal or the modulated analog receive signal, and to vary the resolution in dependence on the detected property of the transmission channel when providing the modulated analog transmit signal or when providing the digital receive data signal.

9. The signal processing circuit as claimed in claim 1, configured to detect a transmit gain or a transmitting power of the modulated analog transmit signal or to detect an input amplification or an input power of the modulated analog receive signal; and
to vary the resolution in dependence on the detected transmit gain or transmitting power of the modulated analog transmit signal when providing the modulated analog transmit signal; or
to vary the resolution in dependence on the detected input amplification or input power of the modulated analog receive signal when providing the digital receive data signal.

10. The signal processing circuit as claimed in claim 1, configured to vary the resolution in dependence on a signal standard to which the modulated analog transmit signal or the modulated analog receive signal corresponds when providing the modulated analog transmit signal or when providing the digital receive data signal.

11. The signal processing circuit as claimed in claim 1, configured to vary the resolution in dependence on a data rate of the modulated analog transmit signal or on a data rate of the modulated analog receive signal when providing the modulated analog transmit signal or when providing the digital receive data signal.

12. The signal processing circuit as claimed in claim 1, configured to detect a temperature so as to vary the resolution in dependence on the temperature detected when providing the modulated analog transmit signal or when providing the digital receive data signal.

13. The signal processing circuit as claimed in claim 1, configured to reduce—in a predefined lower transmitting power range of the modulated analog transmit signal when there is a decrease in the transmitting power of the modulated analog transmit signal—a bit width of a digital signal processing part of the signal processing circuit such that an actual curve of the spectral mask (SEM) of the signal processing circuit at least in the lower transmitting power range is below a requirement curve for the spectral mask.

14. The signal processing circuit as claimed in claim 13, configured to increase the bit width of the digital signal processing part in the event of an increase in the transmitting power when the actual curve of the spectral mask approximates the requirement curve for the spectral mask.

15. The signal processing circuit as claimed in claim 13, configured to vary the bit width of the digital signal processing part such that in the lower transmitting power range, a difference between the actual curve of the spectral mask and the requirement curve for the spectral mask is minimized.

16. The signal processing circuit as claimed in claim 13, wherein a lower limit of the lower transmitting power range, within which the signal processing circuit varies the bit width of the digital signal processing part, is determined by the minimum transmitting power that may be used, and an upper limit of the lower transmitting power range results from the transition of the requirement curve for the spectral mask to the horizontal range.

17. The signal processing circuit as claimed in claim 13, further comprising at least one table comprising a plurality of values of the transmitting power of the modulated analog transmit signal or ranges of values of the transmitting power of the modulated analog transmit signal; wherein in the table a value or a range of values of the transmitting power of the modulated transmit signal has associated therewith a bit width, which is to be set, of the digital signal processing part; and
the signal processing circuit being configured to set the bit width of the digital signal processing part on the basis of the at least one table and in dependence on the transmitting power of the modulated analog transmit signal.

18. The signal processing circuit as claimed in claim 1, further configured to vary, when providing the modulated analog transmit signal or when providing the modulated digital receive data signal, a supply voltage or a biasing current of an analog signal processing part of the signal processing circuit on the basis of the detected or predefined parameter or on the basis of the further detected or predefined parameter.

19. The signal processing circuit as claimed in claim 17, configured to reduce the supply voltage or the biasing current of the analog signal processing part—in a predefined upper transmitting power range of the modulated analog transmit signal—when the transmitting power of the modulated analog transmit signal increases, such that an actual curve of the adjacent channel leakage ratio of the signal processing circuit will be below, at least in the upper transmitting power range, below a requirement curve for the adjacent channel leakage ratio.

20. The signal processing circuit as claimed in claim 17, configured to vary the supply voltage or the biasing current of the analog signal processing part such that a difference between the actual curve of the adjacent channel leakage ratio of the signal processing circuit and the requirement curve for the adjacent channel leakage ratio is minimized in the upper transmitting power range.

21. The signal processing circuit as claimed in claim 17, wherein a lower limit of the upper transmitting power range is −40 dBm.

22. A signal processing circuit for providing a digital receive data signal on the basis of a modulated analog receive signal;
the signal processing circuit comprising one or more digital circuit components and one or more analog circuit components, the signal processing circuit being configured to vary a resolution of at least one of the one or more digital circuit components in dependence on a detected or predefined parameter when providing the digital receive data signal,
wherein the detected or predefined parameter comprises a parametric or environmental condition associated with signal processing circuit.

23. A method, comprising:
providing a modulated analog transmit signal on the basis of a digital transmit data signal using a signal processing circuit; and
varying a resolution of a circuit component of the signal processing circuit in dependence on a detected or predefined parameter when providing the modulated analog transmit signal,
wherein the detected or predefined parameter comprises a parametric or environmental condition associated with the signal processing circuit.

24. A method, comprising:
providing a digital receive data signal on the basis of a modulated analog receive signal using a signal processing circuit; and
varying a resolution of a circuit component of the signal processing circuit in dependence on a detected or predefined parameter when providing the digital receive data signal,
wherein the detected or predefined parameter comprises a parametric or environmental condition associated with the signal processing circuit.

25. A computer program comprising a program code stored in a non-transitory medium for performing a method of providing a modulated analog transmit signal on the basis of a digital transmit data signal using a signal processing circuit, said method comprising:
evaluating a detected or predefined parameter of one or more components of the signal processing circuit; and
varying a resolution of a circuit component of the signal processing circuit in dependence on a detected or predefined parameter when providing the modulated analog transmit signal,
when the program runs on a computer,
wherein the detected or predefined parameter comprises a parametric or environmental condition associated with the signal processing circuit.

26. A computer program comprising a program code stored in a non-transitory medium for performing a method of providing a digital receive data signal on the basis of a modulated analog receive signal using a signal processing circuit, said method comprising:
evaluating a detected or predefined parameter of one or more components of the signal processing circuit; and
varying a resolution of a circuit component of the signal processing circuit in dependence on a detected or predefined parameter when providing the digital receive data signal, when the program runs on a computer,
wherein the detected or predefined parameter comprises a parametric or environmental condition associated with the signal processing circuit.

* * * * *